United States Patent [19]

Tanaka et al.

[11] 4,328,442
[45] May 4, 1982

[54] PIEZOELECTRICALLY DRIVEN TUNING FORK WITH DAMPING MEANS

[75] Inventors: Toshiharu Tanaka, Hirakata; Naoteru Tsuda, Katano; Kazuhide Arase, Neyagawa, all of Japan

[73] Assignee: Matsushita Electric Industrial Co., Ltd., Osaka, Japan

[21] Appl. No.: 98,898

[22] Filed: Nov. 30, 1979

[30] Foreign Application Priority Data

Dec. 7, 1978 [JP] Japan .......................... 53-169751[U]
Dec. 7, 1978 [JP] Japan .......................... 53-169752[U]
Dec. 7, 1978 [JP] Japan .......................... 53-169753[U]
Dec. 7, 1978 [JP] Japan .......................... 53-169755[U]

[51] Int. Cl.³ ........................................... H01L 41/08
[52] U.S. Cl. .................................... 310/326; 310/321
[58] Field of Search ................ 310/25, 370, 321, 326, 310/345, 351–353; 84/409, 457; 333/200

[56] References Cited

U.S. PATENT DOCUMENTS

| | | | |
|---|---|---|---|
| 3,354,413 | 11/1967 | Ko | 310/345 X |
| 3,816,778 | 6/1974 | Frey | 310/25 |
| 3,986,150 | 10/1976 | Tanaka et al. | 310/321 X |
| 4,037,179 | 7/1977 | Terayama | 310/25 X |
| 4,104,553 | 8/1978 | Engdahl | 310/352 |

FOREIGN PATENT DOCUMENTS 2267160  2/1975  France .............................. 310/353

*Primary Examiner*—Mark O. Budd
*Attorney, Agent, or Firm*—Burgess, Ryan & Wayne

[57] ABSTRACT

In a piezoelectric tuning fork of the type which is used as an electro-mechanical filter and wherein a tuning fork is directly supported by a supporting member extended from a terminal plate, the supporting member is surrounded with a vibration isolation or absorbing member which in turn is bonded or otherwise joined to both the supporting member and the terminal plate, whereby the noise output due to the transmission of external vibrations or impacts may be considerably suppressed.

4 Claims, 14 Drawing Figures

4,328,442

PIEZOELECTRICALLY DRIVEN TUNING FORK WITH DAMPING MEANS

BACKGROUND OF THE INVENTION

The present invention relates to a piezoelectric tuning fork assembly which may be used as an electromechanical filter.

In the conventional piezoelectric tuning forks, a supporting member or stem which supports a tuning fork is formed integral with a grounding terminal and is extended upright from a terminal plate. Alternatively, the supporting member and the grounding terminal are formed separately. In both cases, the supporting member is extended from the terminal plate so that external vibrations or impacts are transmitted through the supporting member to the tuning fork, causing noise.

In order to overcome this problem, there has been proposed a construction wherein the terminal plate and the supporting member are mounted through vibration isolation members and the supporting member and the grounding terminal are interconnected with a fine lead wire. However this construction is very complex so that the piezoelectric tuning forks cannot be mass produced at low costs.

SUMMARY OF THE INVENTION

It is therefore an object of the present invention to provide a piezoelectric tuning fork wherein a tuning fork supporting member is surrounded or fitted with a vibration isolation or absorbing member or block which in turn is securely bonded or otherwise joined to the supporting member and a terminal plate from which is extended the supporting member, whereby the noise output may be considerably suppressed.

BRIEF DESCRIPTION OF THE DRAWINGS

Same reference numerals are used to designate similar parts throughout the figures.

DETAILED DESCRIPTION OF THE PRIOR ART

Figure 1:
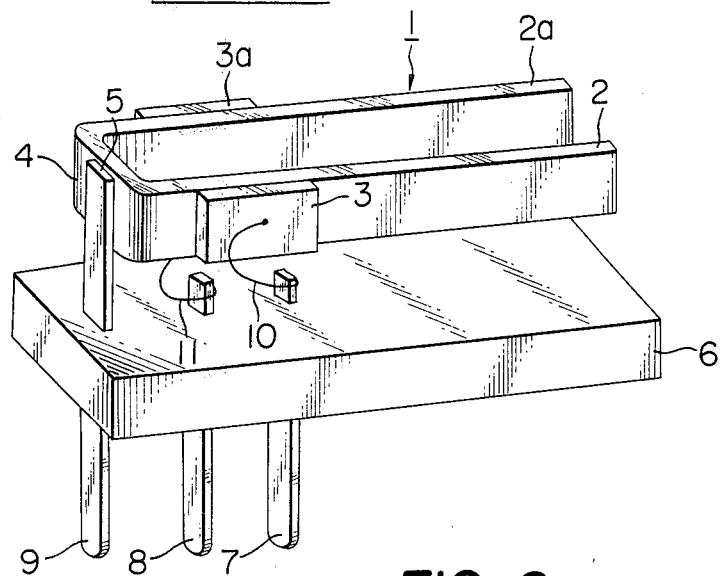
FIG. 1 is a perspective view of a typical prior art piezoelectric tuning fork.

Referring to FIG. 1, a conventional piezoelectric tuning fork comprises a tuning fork 1 with two prongs 2 and 2a and a base 4, piezoelectric transducers 3 and 3a mounted on the prongs 2 and 2a, respectively, adjacent to their nods, a stem or a tuning fork supporting member 5 extended from a terminal plate 6 and securely joined to the base 4 by welding or the like. In general, both the tuning fork and stem are made of the same metal having a constant elastic constant such as Ni-Spn-C or its equivalent. Extended from the terminal plate 6 are an input terminal 7, an output terminal 8 and a grounding terminal 9 which is formed integral with the stem or supporting member 5. The input and output terminals 7 and 8 are electrically connected to the piezoelectric transducers 3 and 3a with lead wires 10 and 11.

Regardless of the fact that the stem 5 is formed integral with or independently of the grounding terminal 9, the former is directly extended from the terminal plate 6. As a result, when external vibrations or shocks are transmitted to a casing which is not shown, but is mounted on the terminal plate 6 so as to encase the tuning fork, the terminals 7, 8 and 9 and the terminal plate 6, the vibrations or shocks are also transmitted through the stem 5 to the tuning fork 1, whereby noise is produced, resulting in the malfunction of an associated circuit (not shown).

DESCRIPTION OF THE EMBODIMENTS

Figure 2:
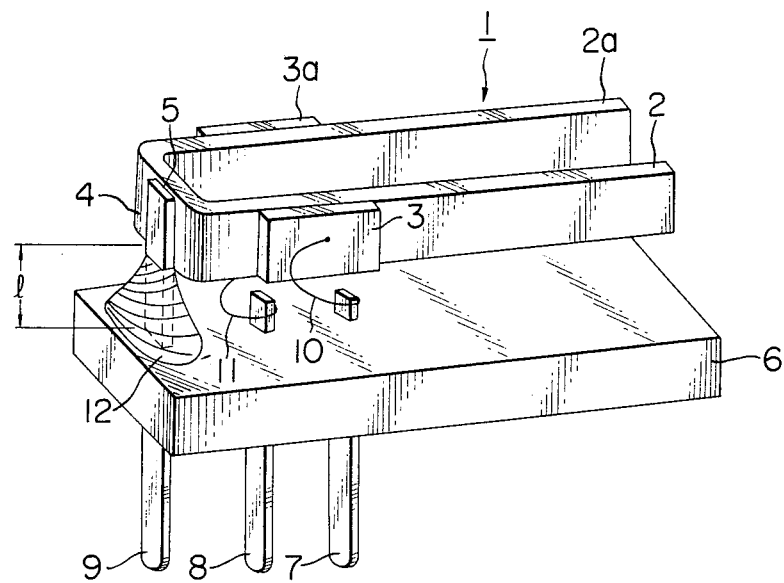
FIG. 2 is a perspective view of a first embodiment of a piezoelectric tuning fork assembly in accordance with the present invention.
Figure 3:
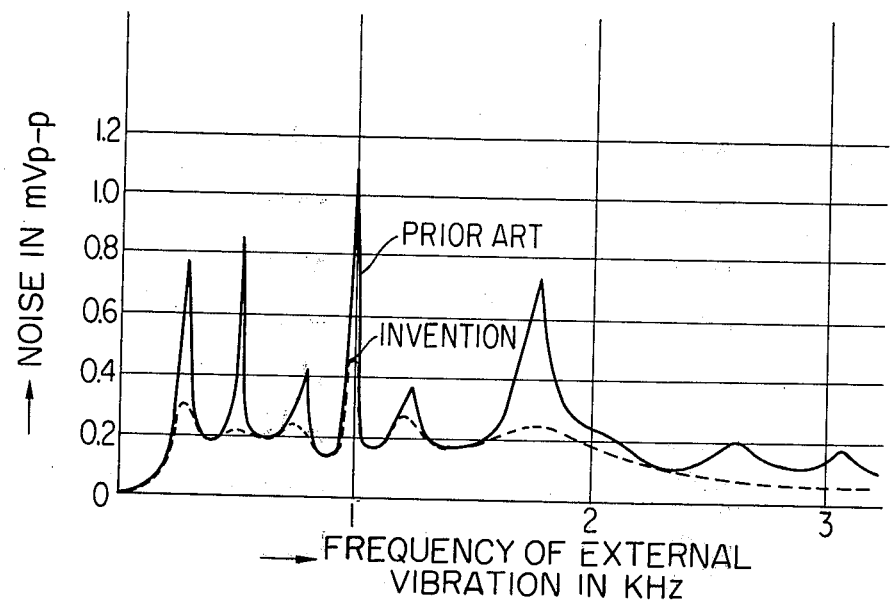
FIG. 3 shows the characteristic curves of the piezoelectric tuning forks of the prior art and the present invention.

First Embodiment, FIGS. 2 and 3

The first embodiment shown in FIG. 2 is substantially similar in construction to the prior art piezoelectric tuning fork shown in FIG. 1 except some features to be described below. Firstly, the length l of the stem 5 between the upper surface of the terminal plate 6 and the lower edge of the tuning fork (that is, the length of the free portion of the stem 5) is between one to three millimeters (mm) and the cross sectional area of the free portion l is between 0.1 and 0.5 mm$^2$. Secondly, the free portion l is closely surrounded with a vibration or shock isolation or absorbing member 12 which is made most preferably of soft elastic materials such as butyl rubber. The grounding terminal 9 may be formed independently of the stem 5.

Since the free portion l of the stem 5 is surrounded with the vibration absorbing member 12, the transmission of the external vibrations or shocks to the tuning fork 1 may be considerably suppressed so that the noise due to the transmission of the external force to the tuning fork 1 may be considerably reduced in level. Even when the frequency of the external vibrations or shocks should coincide with the resonance frequency of the stem 5 or the prongs 2 and 2a of the tuning fork 1, the vibration of the stem 5 may be kept minimum due to the resilient property of the vibration isolation or absorbing medium 12 so that the noise level may be kept minimized.

As described above, the free portion l of the stem 5 is between 0.1 and 0.5 mm$^2$ in cross sectional area and is between one and three millimeters in length. As a result, the noise output due to the external vibrations of less than 2 KHz may be further decreased in level. In addition, even when the external vibrations or shocks of greater amplitudes are transmitted to the stem 5, its breakdown may be avoided and the prongs 2 and 2a may be prevented from striking against the casing, thus resulting in the variation in characteristics of the piezoelectric tuning fork. Therefore it is most effective to mount the piezoelectric tuning fork assembly of the present invention on a printed circuit board which in turn is mounted adjacent to a speaker. That is, when the vibrations of the speaker are at lower frequencies less than one to two KHz, the amplitudes are greater, and vice versa. And in general the resonant frequencies of the printed circuit boards are less than 2 KHz. As a result, the noise output of the piezoelectric tuning fork assembly must be less especially when the external vibrations are less than 2 KHz.

When the free portion of the stem 5 is long in length and large in cross sectional area, the stem has a low resonant frequency. Therefore the inherent vibrations of the tuning fork 1 are not adversely affected when the frequency of the external vibrations is higher than the resonant frequency, but when the frequency of the external vibrations is at or adjacent to the resonant frequency, the tuning fork 1 is vibrated in resonance at greater amplitudes and strikes against the casing (not shown), thus resulting in the variation in characteristics of the piezoelectric tuning fork assembly and in the breakdown of the stem. However when the free portion 1 of the stem 5 is made shorter and its cross sectional area is increased, the vibration or shock absorption or isolation effects of the vibration isolation or absorbing member 12 are considerably decreased. The present invention was made based on various data obtained after the extensive studies and experiments on the size of the stem 5.

In general, the tuning forks of the type used in the piezoelectric tuning fork assemblies have prongs 0.3 to 0.6 mm in thickness and have the fundamental frequencies ranging from 280 to 3000 Hz. When such a tuning fork is supported by the stem 1 to 3 mm in length and 0.1 to 0.5 mm$^2$ in cross sectional area and the stem is closely surrounded with the vibration isolation or absorbing member 12 which is made of soft elastic materials such as butyl rubber and which is also closely pressed against the terminal plate 5, the noise output due to the external vibrations of less than 2 KHz may be most effectively suppressed. In addition, the prongs 2 and 2a of the tuning fork 1 may be prevented from striking against the casing and the damage to the stem 5 may be avoided. However when the stem 5 is greater than 0.5 mm$^2$ in cross sectional area and is shorter than one millimeter in length, the effective suppression of the noise output cannot be attained even when the vibration isolation or absorbing member 12 is provided. When the stem 5 is smaller than 0.1 mm$^2$ in cross sectional area and is longer than 3 mm in length, the mechanical strength of the stem 5 is decreased and the amplitudes of the vibrations of the tuning fork 1 are increased when the frequency of the external vibrations less than 2 KHz is at or adjacent to the resonant frequency of the tuning fork 1. As a result, the prongs 2 and 2a of the tuning fork strike against the casing and the stem 5 is damaged.

FIG. 3 shows the noise output characteristic curve (solid line) of a prior art piezoelectric tuning fork assembly and that (broken lines) of the present invention when the resonant frequency of the tuning forks is 1 KHz. It is readily seen that the present invention exhibits by far excellent characteristics than the prior art.

Even when a great impact is applied to the piezoelectric tuning fork assembly, the noise output may be also considerably suppressed because the tuning fork 1 vibrates at a resonant frequency in asymmetric mode which is lower than the fundamental frequency in symmetric mode.

According to the first embodiment, the vibration isolation or absorbing member 12 may be formed only by applying a vibration isolation or absorbing medium around the free portion of the stem 5. In other words, it is not needed to interpose a vibration isolation or absorbing member between the tuning fork 1 and the terminal plate 6 and joint it to them with adhesives. As a result, the piezoelectrically driven tuning fork assemblies in accordance with the present invention may be mass produced at less cost.

SECOND EMBODIMENT, FIGS. 4 AND 5

Figure 4:
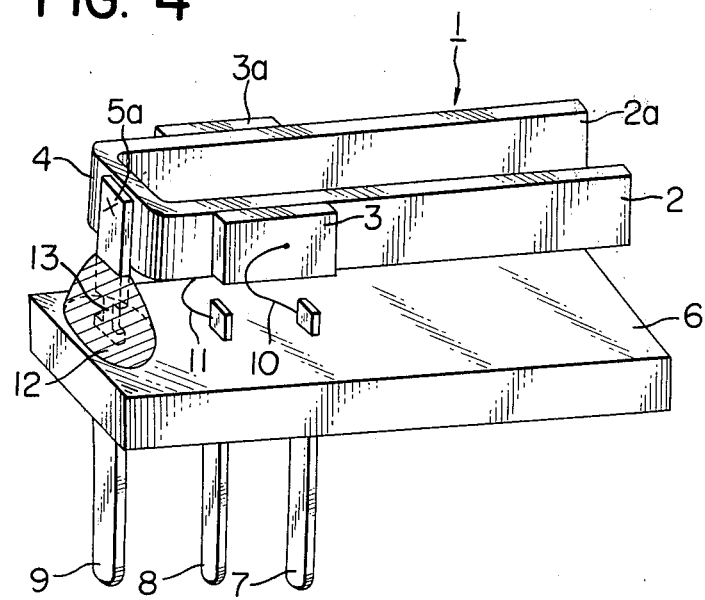
FIG. 4 is a perspective view of a second embodiment of the present invention.
Figure 5:
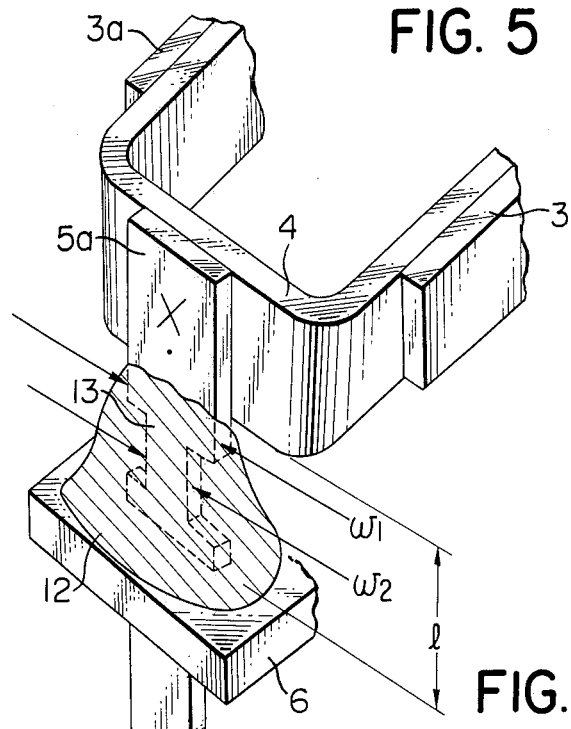
FIG. 5 is a fragmentary perspective view, on enlarged scale, thereof.

In the second embodiment shown in FIGS. 4 and 5, the supporting stem 5a is welded at X to the base 4 of the tuning fork 1. The free portion 1 of the supporting stem 5a has a reduced-width portion; that is, the portion 13 which is intermediate between the ends of the free portion and whose width $w_2$ is shorter than the width $w_1$ of the welded portion X. The vibration isolation or absorbing medium 12 is applied in the manner described above. Instead of forming the reduced-width portion 13, the thickness of the portion 13 may be reduced.

FIRST MODIFICATION OF SECOND EMBODIMENT, FIG. 6

Figure 6:
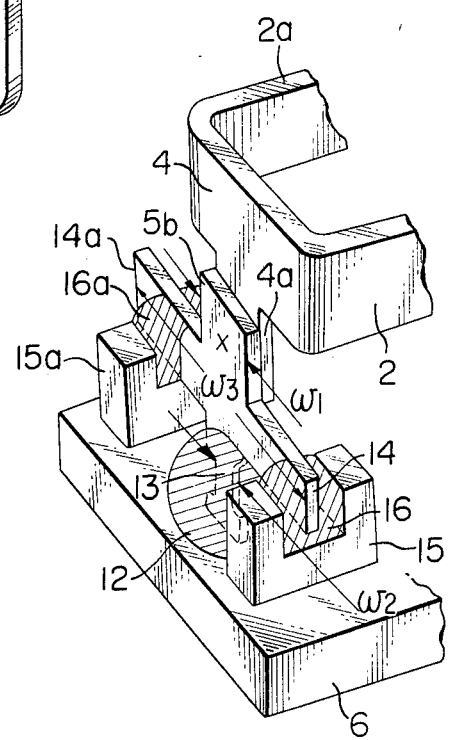
FIGS. 6 and 7 are fragmentary perspective views of modifications of the second embodiment.

In the first modification of the second embodiment shown in FIG. 6, the supporting stem 5b is in the form of a cross. That is, horizontal arms 14 and 14a are extended from the upright portion between the welded portion X and the reduced-width intermediate portion 13. The total length or width of the horizontal arms 14 and 14a is $w_3$. U-shaped supporting blocks 15 and 15a are mounted on the terminal plate 6 symmetrically of the axis of the upright portion of the supporting stem 5b for supporting the ends of the arms 14 and 14a, respectively. Soft, resilient vibration isolation or absorbing members 16 and 16a are interposed between the ends of the arms 14 and 14a on the one hand and the U-shaped supporting blocks 15 and 15a. The vibration isolation or absorbing members 16 and 16a may be formed by applying a vibration isolation or absorbing medium or substance in the manner described above.

In this modification, the upright portion of the cross-shaped supporting member 5b is being shown as being welded at X to a tongue or the like 4a depending from the base 4 of the tuning fork 1, but it is to be understood that the supporting stem 5b may be directly welded to the base 4.

SECOND MODIFICATION OF SECOND EMBODIMENT, FIG. 7

Figure 7:
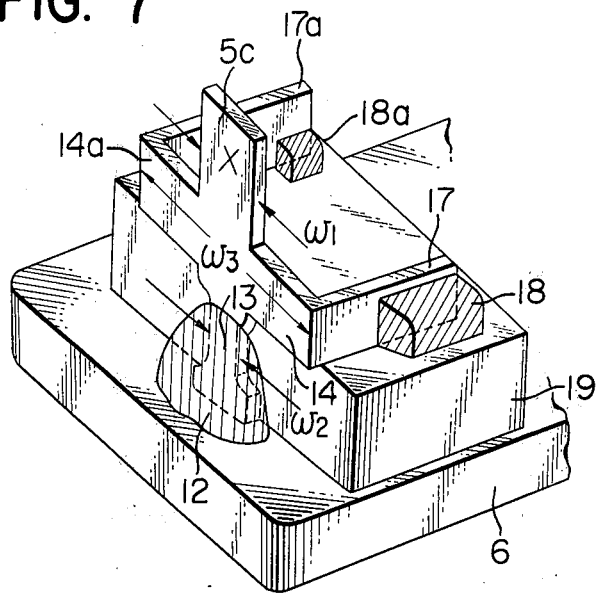

In the second modification shown in FIG. 7, a cross-shaped supporting stem 5c is also used, but the horizontal arms 14 and 14a are longer in length than those of the cross-shaped supporting stem 5b shown in FIG. 6 and are bent in parallel with the prongs 2 and 2a of the tuning fork 1. The bent portions 17 and 17a of the horizontal arms 14 and 14a are supported on a supporting block 19 which is made of a soft and resilient material and is mounted on the terminal plate 6. Vibration isolation or absorbing members 18 and 18a are also formed between the end portions of the bent portions 17 and 17a and the supporting block 19.

According to the second embodiment and its modifications, the supporting stem 5a or the upright portion of the cross-shaped supporting stem 5b or 5c has the reduced-width or -thickness intermediate portion 13. As a result, the stresses due to the external vibrations or impacts tend to concentrate at the reduced-width or reduced-thickness portion 13 so that the same vibration isolation or absorbing effects as when a supporting stem made of a material having less stiffness may be attained. In addition, the portion above the reduced-width intermediate portion 13 is greater both in width and thickness so that the mechanical strength of the upper portion is high and the upper portion may be made into contact with the vibration isolation or absorbing member 12 at a wide area of contact. As a result, even when greater vibrations or impacts are applied from the exterior, the deformations or vibrations of the supporting stem may be minimized so that the noise output may be considerably suppressed. Furthermore the damages to the supporting stem 5 may be avoided.

According to the modification shown in FIG. 6, the horizontal arms 14 and 14a are extended in the directions in which the prongs 2 and 2a of the tuning fork 1 vibrate and their free ends are applied with the vibration isolation or absorbing members 16 and 16a so that the torsion and displacement in the axial direction of the tuning fork 1 of the supporting stem 6b may be more effectively prevented. As a result, even when external vibrations or impacts are transmitted to the tuning fork 1 in the directions of vibrations of the prongs 2 and 2a and in the axial direction of the tuning fork 1, the noise output may be satisfactorily suppressed.

According to the modification shown in FIG. 7, the horizontal arms 14 and 14a are bent in parallel with the prongs 2 and 2a so that even when external vibrations or impacts are transmitted to the terminal plate 6 in the vertical direction, the vertical displacement of the tuning fork 1 may be avoided. Thus even when external vibrations or impacts are transmitted to the piezoelectric tuning fork assembly from any directions, the noise output may be suppressed to a minimum.

THIRD EMBODIMENT, FIG. 8

Figure 8:
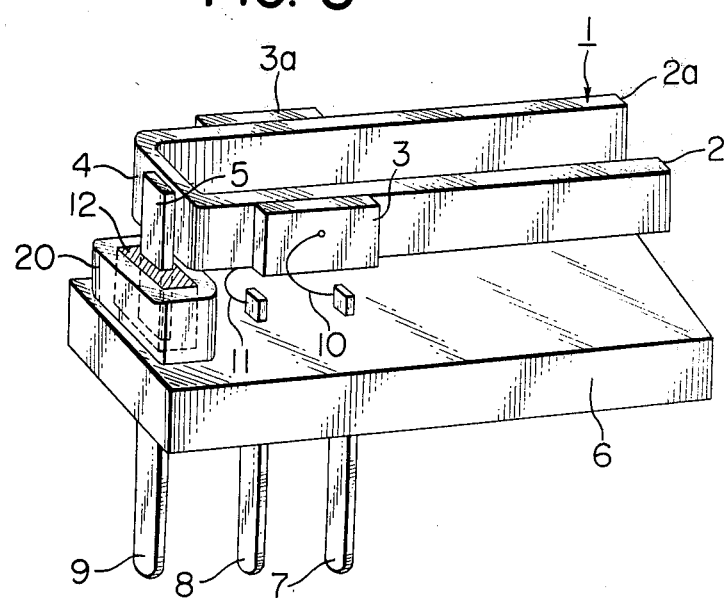
FIG. 8 is a perspective view of a third embodiment of the present invention.

According to the third embodiment shown in FIG. 8, the supporting stem 5 is fitted with the vibration isolation or absorbing member 12 which in turn is fitted into the recess of a box-shaped retaining block 20 mounted on the terminal plate 6. The height of the box-shaped retaining block 20 is such that its upper edge is spaced apart from the lower edge of the tuning fork 1 by a very close distance.

FIRST MODIFICATION OF THIRD EMBODIMENT, FIG. 9

Figure 9:
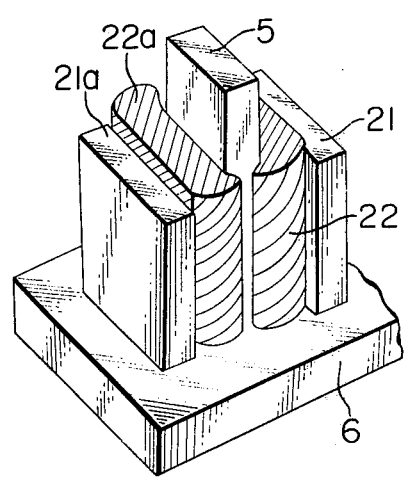
FIGS. 9 and 10 are fragmentary perspective views, respectively, of modifications of the third embodiment.

In the first modification shown in FIG. 9, retaining walls or members 21 and 21a are extended upright from the terminal plate 6 in symmetrical relationship about the supporting stem 5 in the axial direction of the tuning fork 1. Vibration isolation or absorbing members 22 and 22a are press fitted between the supporting stem 5 and the retaining walls or members 21 and 21a.

SECOND MODIFICATION OF THIRD EMBODIMENT, FIG. 10

Figure 10:
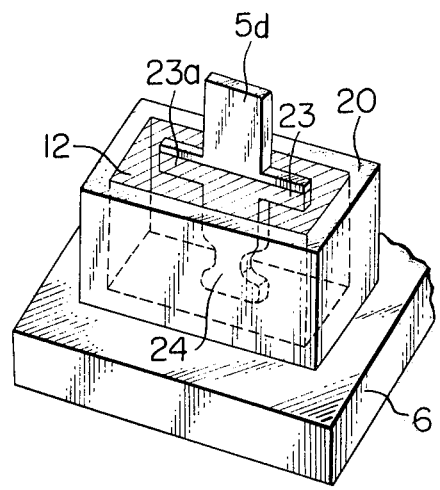

In the second modification of the third embodiment shown in FIG. 10, a cross-shaped supporting stem or member 5d is used. That is, as with the modification shown in FIG. 6, the supporting stem 5d has horizontal arms 23 and 23a and a reduced-width intermediate portion 24. Instead of reducing the width, the thickness may be reduced. Instead of two arms 23 and 23a, only one arm 23 or 23a may be used.

According to the third embodiment and its modification, the supporting stem 5 or 5d of the tuning fork 1 is fitted with the vibration isolation or absorbing member 12 or members 22 and 22a which in turn are retained in the retaining block 20 or between the retaining walls or members 21 and 21a. As a result, the supporting stem 5 or 5d has high mechanical strength so that even when strong vibrations or impacts are applied from the exterior, the damages to the stem 5 may be prevented. In addition, the vibration isolation or absorbing member 12 is retained in the retaining block 20 or the vibration isolation or absorbing members 22 and 22a are retained between the supporting stem 5 and the retaining walls or members 21 and 21a so that when external vibrations or impacts are transmitted, the vibration isolation or absorbing member 12 is compressed and expanded between the supporting stem 5 and the retaining block 20 or the shock absorbing or isolation members 22 and 22a are also compressed and expanded between the supporting stem 5 and the retaining walls 21 and 21a. As a result, the displacement of the supporting stem 5 or 5d may be further suppressed. In other words, external vibrations or impacts may be more effectively isolated or absorbed.

According to the modification shown in FIG. 10, the supporting stem 5d has the reduced-width or reduced-thicknes intermediate portion 24 so that the transmission of external vibrations or impacts from the terminal plate 6 to the tuning fork 1 may be suppressed more effectively. In addition, the portion above the reduced-width or reduced-thickness portion 24 of the supporting stem 5d is made into contact with the vibration isolation or absorbing member 12 with a greater area of contact. As a result, as compared with the supporting stem 5 having a uniform cross section throughout its length, the cross-shaped supporting stem 5d is more resistant to external vibrations or shocks. Furthermore the supporting stem 5d has the horizontal arms 23 and 23a, so that the area of contact with the vibration isolation or absorbing member 12 may be further increased. Moreover, the supporting member 5d may become more resistant to the torsional forces. As a result, even when external vibrations or impacts are transmitted in the directions in which the prongs 2 and 2a of the tuning fork 1 vibrate, the torsion of the supporting stem which will cause adverse effects on the vibrations of the prongs 2 and 2a at their inherent frequency may be avoided. Because of the provision of the box-shaped retaining block 20, the amount of a vibration isolation or absorbing liquid which is filled into the recess of the box-shaped retaining block 20 and cured therein may be suitably controlled. As a result, the variations in noise output from one piezoelectric tuning fork assembly to another may be minimized or almost eliminated, whereby tuning fork assemblies with uniform characteristics may be provided.

FOURTH EMBODIMENT, FIGS. 11 AND 12

Figure 11:
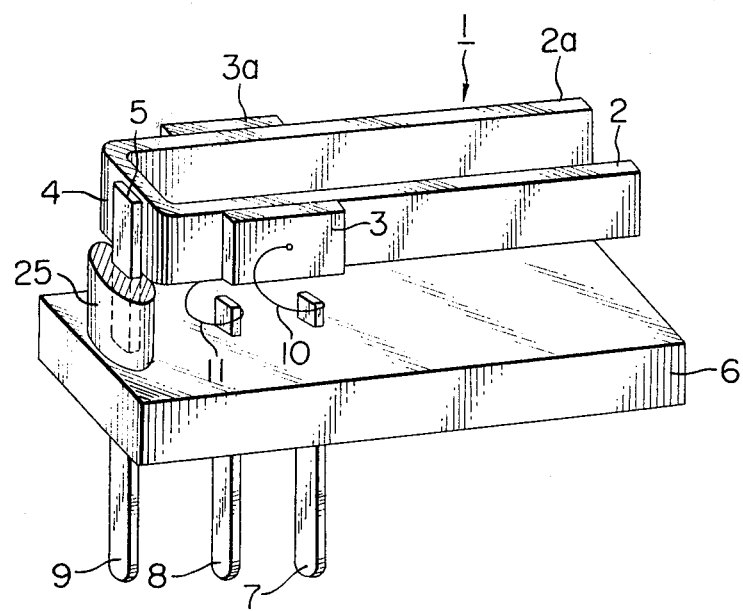
FIG. 11 is a perspective view of a fourth embodiment of the present invention.

In the fourth embodiment shown in FIG. 11, the supporting stem 5 has its free portion fitted with a vibration isolation or absorbing block 25 which is made of the so-called soft, resilient materials such as butyl rubber as with other embodiments. However, it may be made of other materials such as chloroprene rubber or silicon rubber depending upon desired vibration suppressions.

Figure 12:
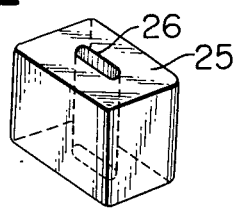
FIG. 12 is a perspective view, on enlarged scale, of a vibration isolation block used in the fourth embodiment shown in FIG. 11.

As best shown in FIG. 12, the vibration isolation or absorbing block 25 is formed with a slot 26 which snugly mates with the supporting stem 5. The height of the block 25 is such that the upper surface thereof is closely spaced apart from the tuning fork 1. The vibration isolation or absorbing block 25 has a uniform wall thickness. In assembly, after the supporting stem 5 is fitted into the vibration isolation or absorbing block 25, the former is joined to the base 4 of the tuning fork 1 by welding or the like, and the lower end of the block 25 is securely joined to the terminal plate 6 with a rubber-like adhesive whose physical and chemical properties are similar to those of the vibration isolation block 25.

Figure 13A:
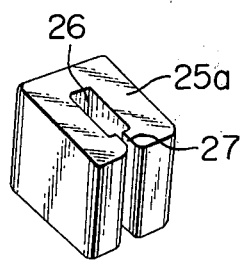
FIGS. 13A and 13B are perspective views, respectively, of two modifications of the vibration isolation block shown in FIG. 12.

A vibration isolation or absorbing block 25a shown in FIG. 13A has a slit 27 through which the supporting member 5 may be fitted into the slot 26 of the block 25a.

Figure 13B:
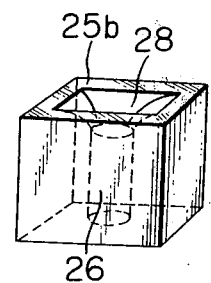

In a vibration isolation or absorbing block 25b shown in FIG. 13B, the slot 26 is made slightly greater in size than that of the block 25 shown in FIG. 12 and is countersunk as shown at 28. After the supporting stem 5 is fitted into the slot 26 and welded to the tuning fork 1, a small amount of adhesive with less viscosity is filled into the countersunk recess 28. The adhesive flows down through the space between the slot 26 and the supporting stem 5 towards the terminal plate 6 so that the block 25b may be easily joined to the plate 6.

In the fourth embodiment and its modifications shown in FIGS. 12, 13A and 13B, the vibration isolation or absorbing blocks 25, 25a and 25b are used whose dimensions are uniform. As a result, the variations in vibration suppression or isolation effects may be avoided from one piezoelectric tuning fork assembly to another in the fabrication and assembly. Furthermore as compared with other embodiments wherein the vibration isolation or absorbing members are formed by the application of a liquefied vibration isolation medium or substance, the productivity may be much enhanced. Furthermore, as compared with the assembly steps of interposing the vibration isolation or absorbing member or members between the supporting stem and the terminal plate 6 and then electrically joining between the supporting stem 5 and the grounding terminal 9, the steps for assemblying the fourth embodiment and its modifications are much simplified and therefore adapted for mass production at less cost. In addition, even when the supporting stem 5 is relatively longer, it may be fitted with a vibration isolation or absorbing block with a uniform wall thickness so that damages to the supporting stem 5 may be eliminated even when strong vibrations or impacts are transmitted.

In the first through fourth embodiments, the supporting stems 5 through 5d may be fabricated as a unit independently of the grounding terminals 9.

In summary, according to the present invention, vibration and shock isolation or absorbing means is fitted over the supporting stem so that even when external vibrations or impacts are transmitted to the terminal plate, the resultant vibrations of the supporting stem may be effectively suppressed so that the adverse effects of the external vibrations or impacts on the inherent vibrations of the tuning fork may be avoided and consequently the noise output may be suppressed to a minimum. In addition, the piezoelectric tuning fork assemblies in accordance with the present invention are advantageous in that their construction is extremely simple and therefore they are adapted for mass production.

What is claimed is:

1. A piezoelectric tuning fork comprising:
a terminal plate;
a supporting member erected on said terminal plate;
a tuning fork securely joined to said supporting member by welding or the like;
two piezoelectric transducers mounted on said tuning fork;
an input terminal and an output terminal mounted on said terminal plate;
lead wires interconnecting said piezoelectric transducers and said input and output terminals;
a vibration isolation or absorbing member surrounding said supporting member and securely fixed to both said terminal plate and said supporting member, the portion of said supporting member which is surrounded with the vibration isolation member being reduced in width as compared with other portions thereof; and
horizontal arms extending from said supporting member between the portion thereof which is joined to said tuning fork and said reduced-width portion thereof, said arms being supported on said terminal plate at the free end portions thereof by soft resilient members.

2. A piezoelectric tuning fork comprising:
a terminal plate;
a supporting member erected on said terminal plate;
a tuning fork securely joined to said supporting member by welding or the like;
two piezoelectric transducers mounted on said tuning fork;
an input terminal and an output terminal mounted on said terminal plate;
lead wires interconnecting said piezoelectric transducers and said input and output terminals;
a vibration isolation or absorbing member surrounding said supporting member and securely fixed to both said terminal plate and said supporting member, the portion of said supporting member which is surrounded with the vibration isolation member being reduced in thickness as compared with other portions thereof; and
horizontal arms extending from said supporting member between the portion thereof which is joined to said tuning fork and said reduced thickness portion thereof, said arms being supported on said terminal plate at the free end portions thereof by soft resilient members.

3. A piezoelectric tuning fork according to claim 1 or 2 wherein the free end portions of said horizontal arms are bent in parallel with the axis of said tuning fork.

4. A piezoelectric tuning fork comprising:
a terminal plate;
a supporting member erected on said terminal plate;
a tuning fork securely joined to said supporting member by welding or the like;
two piezoelectric transducers mounted on said tuning fork;
an input terminal and an output terminal mounted on said terminal plate;
lead wires interconnecting said piezoelectric transducers and said input and output terminals;
a vibration isolation or absorbing member surrounding said supporting member and securely fixed to both said terminal plate and said supporting member;
horizontal arms extending from said supporting member adjacent to the portion thereof which is joined to said tuning fork,
the portions of said supporting member below said horizontal arms being embedded into said vibration isolation member.

* * * * *